(12) United States Patent
Anbari

(10) Patent No.: US 8,283,891 B2
(45) Date of Patent: Oct. 9, 2012

(54) POWER SOURCE HEALTH ASSESSMENT METHODS AND SYSTEMS THEREOF

(75) Inventor: Omar Anbari, Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 708 days.

(21) Appl. No.: 12/077,896

(22) Filed: Mar. 21, 2008

(65) Prior Publication Data

US 2009/0237087 A1    Sep. 24, 2009

(51) Int. Cl.
*H02J 7/00* (2006.01)
*H02J 7/16* (2006.01)

(52) U.S. Cl. ......... 320/132; 320/134; 320/137; 320/136

(58) Field of Classification Search .................. 324/426, 324/429, 433; 320/103, 134, 135, 136, 132, 320/137, 138, 148, 149, 161, 162
See application file for complete search history.

(56) References Cited

U.S. PATENT DOCUMENTS

| | | | | |
|---|---|---|---|---|
| 5,705,929 A * | 1/1998 | Caravello et al. | ............. | 324/430 |
| 6,618,681 B2 * | 9/2003 | Hoenig et al. | ................. | 702/63 |
| 7,554,296 B2 * | 6/2009 | Mizuno et al. | ................. | 320/132 |
| 7,567,086 B2 * | 7/2009 | Salman et al. | ................. | 324/426 |
| 7,626,394 B2 * | 12/2009 | Kimura et al. | ................. | 324/427 |
| 7,652,449 B2 * | 1/2010 | Tae et al. | ........................ | 320/104 |
| 7,728,555 B2 * | 6/2010 | Seo et al. | ....................... | 320/132 |
| 2001/0033169 A1 * | 10/2001 | Singh et al. | .................... | 324/426 |
| 2005/0151657 A1 * | 7/2005 | Lockhart et al. | ........... | 340/636.1 |
| 2006/0284618 A1 * | 12/2006 | Cho et al. | ...................... | 324/430 |
| 2007/0001679 A1 * | 1/2007 | Cho et al. | ...................... | 324/426 |
| 2008/0007203 A1 * | 1/2008 | Cohen et al. | ................... | 320/104 |
| 2008/0024137 A1 * | 1/2008 | Carlin et al. | ................... | 324/427 |
| 2008/0120050 A1 * | 5/2008 | Iwane et al. | .................... | 702/63 |
| 2009/0146664 A1 * | 6/2009 | Zhang | ........................... | 324/433 |

* cited by examiner

*Primary Examiner* — Edward Tso
*Assistant Examiner* — Alexis Boateng
(74) *Attorney, Agent, or Firm* — LeClairRyan, a Professional Corporation

(57) ABSTRACT

A method and system for assessing health of a power source includes measuring voltage and current of a power source in a system using a device in the system as the load. An internal resistance of the power source is determined based on the measured voltage and current. A health assessment of the power source is determined and provided based at least on the determined internal resistance and a stored baseline internal resistance for the power source.

26 Claims, 2 Drawing Sheets

US 8,283,891 B2

POWER SOURCE HEALTH ASSESSMENT METHODS AND SYSTEMS THEREOF

The U.S. Government has a paid-up license in this invention and the right in limited circumstances to require the patent owner to license others on reasonable terms as provided for by the terms of Contract Nos. N00014-03-1-0860 and N00014-05-1-0708 awarded by Office of Naval Research.

FIELD OF THE INVENTION

The present invention relates to assessment systems and, more particularly, to power source health assessment methods and systems thereof.

BACKGROUND

One indicator of the state of health of a lead-acid battery is the conductance of the battery. Conductance can be defined as the AC resistance ideally measured at different frequencies. The measured conductance is linearly related to the Cold Cranking Amp (CCA) for the battery and thus can be used to provide an indication of the state of health of the battery.

Unfortunately, conductance of a battery cannot be easily obtained. Measuring conductance to assess the state of health of a battery requires an undesirable addition of hardware and firmware. As a result, the measurement of conductance to assess the state of a battery is infrequently used.

SUMMARY OF THE INVENTION

A method for assessing health of a power source in accordance with embodiments of the present invention includes measuring voltage and current of a power source in a system using a device in the system as the load. An internal resistance of the power source is determined based on the measured voltage and current. A health assessment of the power source is determined and provided based at least on the determined internal resistance and a stored baseline internal resistance for the power source.

A system for assessing health of a power source in accordance with embodiments of the present invention includes a data acquisition system, an analysis system, and a health assessment system. The data acquisition system measures voltage and current of a power source in a system using a device in the system as the load. The analysis system determines an internal resistance of the power source based on the measured voltage and current. The health assessment system determines and provides a health assessment of the power source based at least on the determined internal resistance and a stored baseline internal resistance for the power source.

The present invention provides a simple, less intrusive, and reliable method and system for providing diagnostics and prognostics on current and future health of a power source and related systems, devices and components.

DETAILED DESCRIPTION

Figure 1:
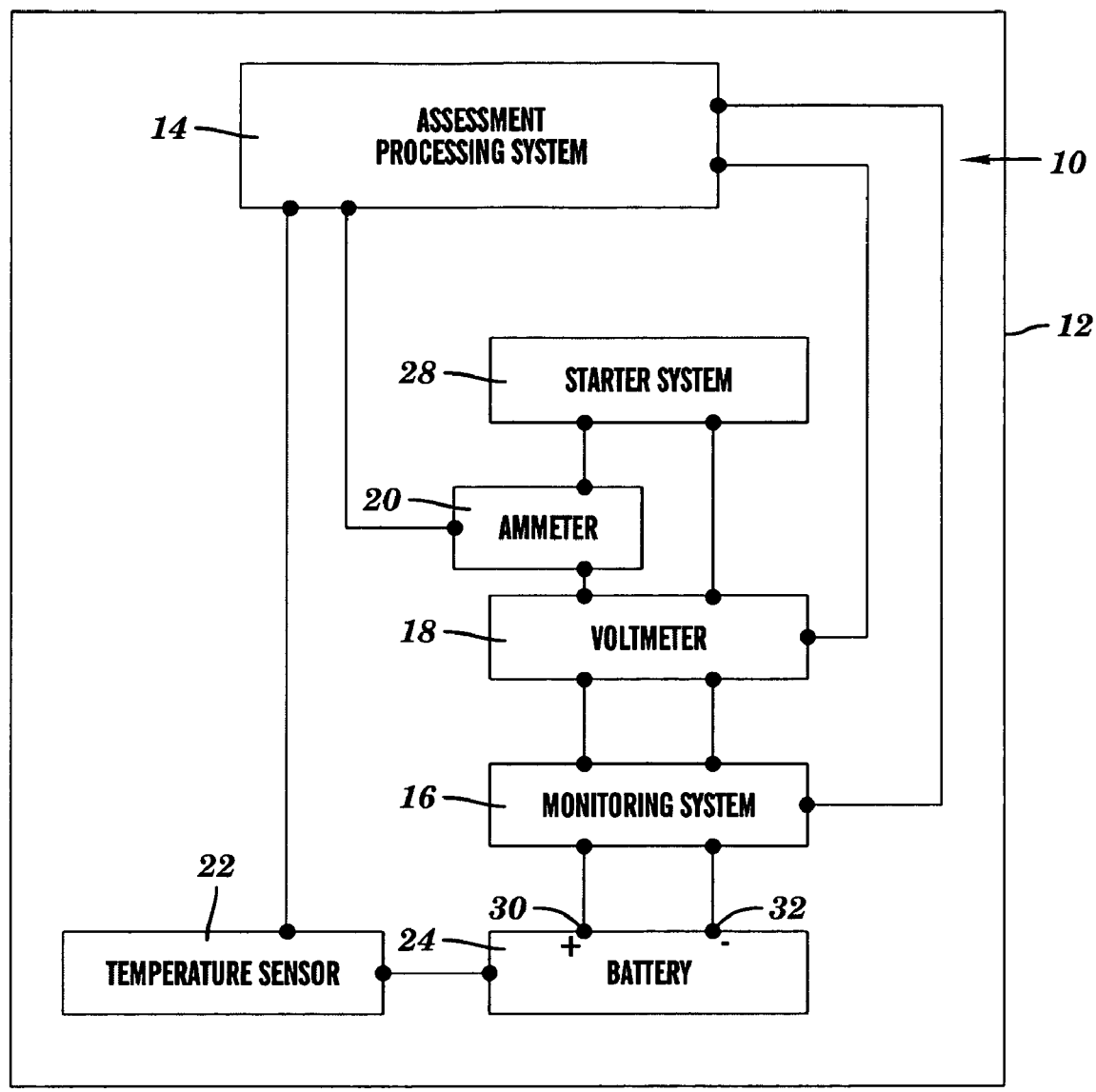
FIG. 1 is a block diagram of a health assessment system in accordance with embodiments of the present invention.

A health assessment system 10 in accordance with embodiments of the present invention is illustrated in a vehicle 12 in FIG. 1. The health assessment system 10 includes an assessment processing system 14, a monitoring system 16, a voltmeter 18, an ammeter 20, and a temperature sensor 22, although the system can include other types and numbers of systems, devices, and components connected in other manners. The present invention provides a simple, less intrusive, and reliable method and system for providing diagnostics and prognostics on current and future health of a power source and related systems, devices, and components.

Referring more specifically to FIG. 1, the health assessment system 10 is located in the vehicle 12 which has a battery 24 and a starter system 28, although the health assessment system 10 could be used with other types of systems, devices, and components and the vehicle 12 can have other types and numbers of systems, devices, and components. The battery 24 is a lead-acid battery 24 with a positive terminal 30 and a negative terminal 32, although other types and numbers of power sources can be used. The starter system 28 is coupled to the positive and negative terminals 30 and 32 of the battery 24 and is used to start other types and numbers of systems, devices, and components in the vehicle 12, such as an engine by way of example only.

The assessment processing system 14 provides a diagnostic and prognostic assessment of the battery 24 and other related systems, devices, and components, such as the starter system 28 by way of example only, although the assessment processing system 14 can have other types and numbers of functions. The assessment processing system 14 includes a central processing unit (CPU) or processor, a memory, user input device, a display, and an interface system, and which are coupled together by a bus or other link, although the assessment processing system 14 can include other numbers and types of components, parts, devices, systems, and elements in other configurations. The processor in the assessment processing system 14 executes a program of stored instructions for one or more aspects of the present invention as described and illustrated herein, including methods for assessing health of a power source and other related system, devices, and components, although the processor could execute other numbers and types of programmed instructions.

The memory in the assessment processing system 14 stores these programmed instructions for one or more aspects of the present invention as described and illustrated herein, including methods for assessing health of a power source and other related system, devices, and components, although some or all of the programmed instructions could be stored and/or executed elsewhere. A variety of different types of memory storage devices, such as a random access memory (RAM) or a read only memory (ROM) in the system or a floppy disk, hard disk, CD ROM, or other computer readable medium which is read from and/or written to by a magnetic, optical, or other reading and/or writing system that is coupled to one or more processors, can be used for the memory in the assessment processing system 14.

The user input device in the assessment processing system 14 is used to input selections, such as a request for a diagnostic or prognostic assessment of the battery 24 in the vehicle 12, although the user input device could be used to input other types of data and interact with other elements. The user input device can include a computer keyboard and a computer mouse, although other types and numbers of user input devices can be used. The display in the assessment processing system 14 is used to show data and information to the user, such as the assessment of the power source or related systems, devices, or components by way of example only. The display can include a computer display screen, such as a CRT or LCD screen, although other types and numbers of displays could be used.

The interface system in the assessment processing system 14 is used to operatively couple and communicate between the assessment processing system 14 and the monitoring system 16, the voltmeter 18, the ammeter 20, and the temperature sensor 22 via a communications network, although other types and numbers of communication networks or systems with other types and numbers of connections and configurations can be used.

Although an embodiments of the assessment processing system 14 is described and illustrated herein, the assessment processing system 14 can be implemented on any suitable computer system or computing device. It is to be understood that the devices and systems of the embodiments described herein are for exemplary purposes, as many variations of the specific hardware and software used to implement the embodiments are possible, as will be appreciated by those skilled in the relevant art(s).

Furthermore, the assessment processing system 14 of the embodiments may be conveniently implemented using one or more general purpose computer systems, microprocessors, digital signal processors, and micro-controllers, programmed according to the teachings of the embodiments, as described and illustrated herein, and as will be appreciated by those ordinary skill in the art.

In addition, two or more computing systems or devices can be substituted for the assessment processing system 14 in any embodiment of the embodiments. Accordingly, principles and advantages of distributed processing, such as redundancy and replication also can be implemented, as desired, to increase the robustness and performance of the devices and systems of the embodiments. The embodiments may also be implemented on computer system or systems that extend across any suitable network using any suitable interface mechanisms and communications technologies, including by way of example only telecommunications in any suitable form (e.g., voice and modem), wireless communications media, wireless communications networks, cellular communications networks, G3 communications networks, Public Switched Telephone Network (PSTNs), Packet Data Networks (PDNs), the Internet, intranets, and combinations thereof.

The embodiments may also be embodied in whole or in part as a computer readable medium having instructions stored thereon for one or more aspects of the present invention as described and illustrated by way of the embodiments herein, as described herein, which when executed by a processor, cause the processor to carry out the steps necessary to implement the methods of the embodiments, as described and illustrated herein.

The monitoring system 16 is coupled between the battery 24 and the starter system 28 and to the assessment processing system 14, although other numbers and types of monitoring systems which are coupled in other manners to other systems, devices, and components can be used. The monitoring system 16 monitors and signals the assessment processing system 14 when the starter system 28 is initiated to start the vehicle 12, although the monitoring system 16 can monitor and signal for other types and numbers of events.

The health assessment system 10 also includes and is coupled to the voltmeter 18, the ammeter 20, and the temperature sensor 22, although the health assessment system 10 can have other numbers and types of data acquisition systems which are coupled together in other manners. The voltmeter 18 is coupled across the positive and negative terminals 30 and 32 of the battery 24 and is used to measure the electrical potential difference or voltage, although other numbers and types of voltage measurement systems which are coupled in other manners can be used, such as a Hall Effect voltage sensor. The ammeter 20 coupled in series with the positive terminal 30 of battery 24 and is used to measure a flow of current applied to the starter system 28, although other numbers and types of current measurement systems which are coupled in other manners can be used, such as a Hall Effect current sensor. The temperature sensor 22 is positioned adjacent to and is used to measure an ambient temperature of the battery 24, although other numbers and types of temperature sensors taking other numbers and types of readings can be used.

Figure 2:
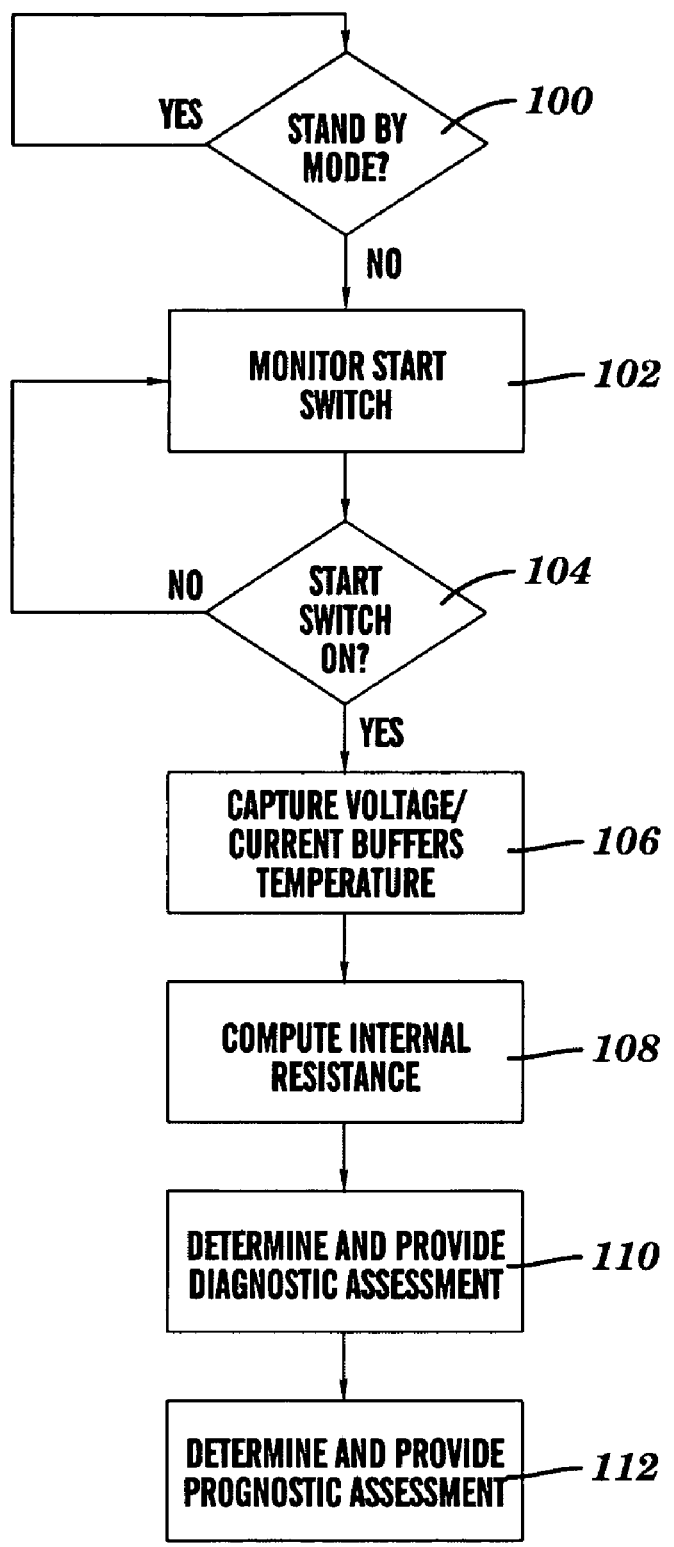
FIG. 2 is a flow chart of a method for assessing health of a power source in accordance with embodiments of the present invention.

An example of the operation of the health assessment system 10 in the vehicle 12 in accordance with embodiments of the present invention will now be described with reference to FIGS. 1-2. As explained in greater detail below, an indicator of the state of health of the battery 24 is the internal resistance of the battery 24 which is much simpler and easier to measure and utilize than conductance. In step 100, a determination is made if the health assessment system 10 in vehicle 12 is in standby mode. If the health assessment system 10 in vehicle 12 remains in standby mode, then the Yes branch loops back and stays in step 100. If the health assessment system 10 in vehicle 12 no longer remains in standby mode, then the No branch is taken to step 102.

In step 102, the monitoring system 16 monitors when the starter system 28 is initiated to start the vehicle 12. In step 104, the monitoring system 16 determines if the starter system 28 has been initiated to start the vehicle 12, although the monitoring system 16 could monitor other types of systems, devices, and components based on other factors. If the monitoring system 16 determines the starter system 28 has not been initiated to start the vehicle 12, then the No branch is taken back to step 102. If the monitoring system 16 determines the starter system 28 has been initiated to start the vehicle 12, then the monitoring system 16 signals the assessment processing system 14 that the starter system 28 has been initiated to start the vehicle 12 and the Yes branch is taken back to step 106. Accordingly, another advantage of the present invention is only one signal has to be monitored and no memory must be allocated to capture data until the monitoring system 16 determines the starter system 28 has been initiated to start the vehicle 12.

In step 106, the voltmeter 18 measures the voltage being applied to the starter system 28 across the positive and negative terminals 30 and 32 of battery 24, the ammeter 20 measures the current 20 applied to the starter system 28, and the temperature sensor 22 is positioned adjacent to and is used to measure an ambient temperature of the battery 24, although other types and numbers of data can be acquired, such as just the voltage and current readings by way of example only. The readings from the voltmeter 18, ammeter 20, and temperature sensor 22 are captured during the transient when the starter system 28 initiates a start of the vehicle 12. Additionally, the reading from the voltmeter 18 and the reading from the ammeter 20 are obtained by averaging samples taken at a rate of about two kHz during the transient which lasts about 400 milliseconds, although other numbers of readings, such as a single voltage and single current reading, other sampling rates, and other time periods for sampling can be used.

In step 108, the assessment processing system 10 determines an internal resistance of the battery 24 based on the measured voltage and current readings obtained from the voltmeter 18 and the ammeter 20, although the assessment processing system can perform other types and numbers of determinations. By way of example only, the internal resistance of the battery 24 can be determined as explained below. The output voltage of battery 24 can be calculated at any time as:

$$V_{out} = V_{oc} - R_{int} \times I_{batt}$$

$V_{out}$: Battery output voltage.
$V_{oc}$: Open circuit voltage directly proportional to the state of charge of the battery
$R_{int}$: Battery resistive internal resistance
$I_{batt}$: Battery output current (positive if the battery is sourcing current)

If a high speed transient is applied to the battery 24, such as during a start initiated by starter system 28 by way of example only, then the voltage drop observed at the positive and negative terminals 30 and 32 of battery 24 is only due to internal resistance, as the change in state of charge over a small δt can be ignored. Therefore, the difference between the output voltages of the battery 24 over the δt can be approximated to:

$$\Delta V = -R_{int}(I_2^{batt} - I_1^{batt})$$

And the internal resistance can be determined by the assessment processing system 10 using:

$$R_{int} = \frac{V_1^{out} - V_2^{out}}{I_2^{batt} - I_1^{batt}}$$

With the present invention, the transient applied to the battery 24 is relatively fast, on the order of a few milliseconds in this particular example, to ignore the effects of change in state of charge and significant in level to obtain an acceptable resolution. Again in this example, an applied transient which satisfies this requirement is the starting process by the starter system 28, although other types of systems, devices, and components that apply a transient could be used.

In step 110, the assessment processing system 10 determines and provides a current diagnostic health of the battery 24 based on a comparison of the determined internal resistance of the battery 24 and a baseline internal resistance for the battery 24 stored in the memory of the assessment processing system 10, although other types of diagnostics can be performed and the baseline internal resistance and other data can be stored and retrieved from other locations. If the determined internal resistance is more than a set percentage above the stored baseline internal resistance, then the battery 24 is assessed to fail. In this particular example, the battery 24 is a lead-acid battery and if the determined internal resistance of the battery 24 increases to more than 25% above its known good base line internal resistance, the battery 24 will fail a capacity test, although other percentages can be used. Additionally, other types of current diagnostic health assessments besides a pass/fail determination could be determined and provided by the assessment processing system 10. By way of example only, an estimate of the remaining useful life of the battery 24 based on the percentage difference between the determined internal resistance of the battery 24 and the baseline internal resistance for the battery 24 and historical life span data for the battery 24 could be determined by the assessment processing system 10.

The assessment processing system 10 may optionally further refine and provide the current diagnostic health assessment of the battery 24 based on a comparison of the measured ambient temperature reading from the temperature sensor 22 against stored temperature efficiency data for the battery 24, although other types of diagnostics can be performed. Ambient temperature has an effect on the internal resistance of battery 24. Batteries usually reach their peak efficiency at a 32° C. temperature. At −18° C., the efficiency of batteries or drops to about 40% of rated output. This is due to the fact that at low temperatures, the chemical reactions are slowed and the "chemical resistance" drastically increases. Internal resistance and temperature are linked by the following empirical relationship:

$$R_T = R_{ref} + T_C \frac{T_{ref} - T}{T_{ref}}$$

$T_c$ is a temperature compensation factor.

The temperature compensation factor is battery dependent. Accordingly, the assessment processing system 10 obtains and stores in memory for battery 24 curves which comprises stored temperature efficiency data that assists the assessment processing system 10 in differentiating between loss of performance due to diminishing state of health and low temperatures.

The assessment processing system 10 may also optionally determine and provide a current diagnostic health assessment of the starter system 28 based on the determined internal resistance and a stored baseline internal resistance for the starter system 28, although the assessment processing system may determine and provide a diagnostic health assessment of other types of systems, devices, and components in other manners. By way of example only, an automotive starter system is characterized by an internal resistance that varies with its' state of health and operating conditions, such as temperature, humidity etc. By capturing and trending this internal resistance during the useful lifetime of the automotive starter system the assessment processing system 10 can provide a diagnostic indication of the automotive starter system's current state of health and can provide a prognostic indication of the automotive starter system's projected future state of health.

In step 112, the assessment processing system 10 determines and provides a prognostic health assessment of the battery 24 based on the determined internal resistance and stored, internal resistance life-cycle data for the battery 24, although other types of prognostics on the battery 24 and other types of systems, devices, and components can be performed.

Accordingly, as described and illustrated herein the present invention provides a simple, less intrusive, and reliable method and system for providing diagnostics and prognostics on current and future health of a power source and related systems, devices and components.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefor, is not intended to limit the claimed processes to any order except as may be specified in the claims. Accordingly, the invention is limited only by the following claims and equivalents thereto.

What is claimed is:

1. A method for assessing health of a power source, the method comprising:
   measuring voltage and current of a power source in a system at a start and a stop of a transient period of time using a device in the system as the load;
   determining an internal resistance of the power source based on a difference of the measured voltages at the start and stop of the transient period of time divided by a difference of the measured current at the start and stop of the transient period of time; and
   determining and providing a health assessment of the power source based on at least on the determined internal resistance and a stored baseline internal resistance for the power source.

2. The method as set forth in claim 1 further comprising triggering the measuring based on at least one event in the system.

3. The method as set forth in claim 2 wherein at least one event is a start of the system.

4. The method as set forth in claim 1 wherein the measuring voltage and current of the power source further comprises measuring the voltage and current at a sampling rate above at least a first frequency.

5. The method as set forth in claim 4 wherein the first frequency is at least two kHz.

6. The method as set forth in claim 1 wherein the determining and providing the health assessment of the power source further comprises:
   comparing the determined internal resistance against the stored baseline internal resistance for the power source; and
   providing a failing health assessment of the power source if the comparison indicates the determined internal resistance is more than a first percentage above the stored baseline internal resistance.

7. The method as set forth in claim 6 wherein the first percentage is about twenty-five percent or greater.

8. The method as set forth in claim 1 further comprising applying a transient to the power source for a first period of time, wherein the measuring the voltage and current of the power source occurs at least partially during the application of the transient.

9. The method as set forth in claim 8 wherein the first period of time is 400 milliseconds or less.

10. The method as set forth in claim 8 wherein the device used as the load and which applies the transient comprises a starter system.

11. The method as set forth in claim 1 further comprising:
    measuring an ambient temperature of the power source; and
    comparing the measured temperature against stored temperature efficiency data for the power source;
    wherein the determining and providing a health assessment of the power source further comprises determining and providing the health assessment of the power source based on the comparison of the measured temperature against stored temperature efficiency data.

12. The method as set forth in claim 1 further comprising determining and providing a future prediction on when the power source will fail based on at least the determined internal resistance and stored, internal resistance life-cycle data for the power source.

13. The method as set forth in claim 1 wherein the determining further comprises determining and providing a health assessment of the device used as the load based at least on the determined internal resistance and a stored baseline internal resistance for the device used as the load the changes in the device intrinsic resistance.

14. A system for assessing health of a power source comprising:
    a data acquisition system that measures voltage and current of a power source in a system at a start and a stop of a transient period of time using a device in the system as the load;
    an analysis system that determines an internal resistance of the power source based on a difference of the measured voltages at the start and stop of the transient period of time divided by a difference of the measured current at the start and stop of the transient period of time; and
    an assessment processing system that determines and provides a health assessment of the power source based at least on the determined internal resistance and a stored baseline internal resistance for the power source.

15. The system as set forth in claim 14 further comprising a monitoring system that triggers the data acquisition system to measure the voltage and current of the power source based on at least one event in the system.

16. The system as set forth in claim 15 wherein on at least one event is a start of the system.

17. The system as set forth in claim 14 wherein the data acquisition system measures the voltage and current at a sampling rate above at least a first frequency.

18. The system as set forth in claim 17 wherein the first frequency is at least two kHz.

19. The system as set forth in claim 14 wherein the assessment processing system compares the determined internal resistance against the stored baseline internal resistance for the power source and provides a failing health assessment of the power source if the comparison indicates the determined internal resistance is more than a first percentage above the stored baseline internal resistance.

20. The system as set forth in claim 19 wherein the first percentage is about twenty-five percent or greater.

21. The system as set forth in claim 14 further comprising a transient source system which applies a transient to the power source for a first period of time, wherein the data acquisition system measures the voltage and current of the power source occurs at least partially during the application of the transient.

22. The system as set forth in claim 21 wherein the first period of time is 400 milliseconds or less.

23. The system as set forth in claim 21 wherein the device used as the load and the transient source system comprises a starter system.

24. The system as set forth in claim 14 further comprising a temperature monitoring system that measures an ambient temperature of the power source, wherein the assessment processing system compares the measured temperature against stored temperature efficiency data for the power source and further determines and provides the health assessment of the power source based on the comparison of the measured temperature against stored temperature efficiency data.

25. The system as set forth in claim 14 wherein the assessment processing system determines and provides a future prediction on when the power source will fail based on at least the determined internal resistance and stored, internal resistance life-cycle data for the power source.

26. The system as set forth in claim 14 wherein the assessment processing system determines and provides a health assessment of the device used as the load based at least on the determined internal resistance and a stored baseline internal resistance for the device used as the load.

* * * * *